United States Patent [19]
Savatier

[11] Patent Number: 5,400,075
[45] Date of Patent: Mar. 21, 1995

[54] ADAPTIVE VARIABLE LENGTH ENCODER/DECODER

[75] Inventor: Tristan Savatier, Los Angeles, Calif.

[73] Assignee: Thomson Consumer Electronics, Inc., Indianapolis, Ind.

[21] Appl. No.: 2,875

[22] Filed: Jan. 13, 1993

[51] Int. Cl.$^6$ ............ H04N 7/133; H04N 7/137
[52] U.S. Cl. ............ 348/384; 348/390; 348/404; 348/400; 375/241; 341/67
[58] Field of Search ............ 358/136, 135, 133; H04N 7/130, 7/133, 7/137; 348/384, 390, 400, 404; 375/122; 341/51, 67

[56] References Cited

U.S. PATENT DOCUMENTS

| | | | |
|---|---|---|---|
| 4,922,510 | 5/1990 | Brusewitz | 358/133 |
| 4,942,467 | 1/1990 | Waldman et al. | 358/135 |
| 4,957,688 | 9/1990 | De With | 358/135 |
| 4,982,285 | 1/1991 | Sugiyama | 358/135 |
| 5,111,292 | 5/1992 | Kuriacose et al. | 358/133 |
| 5,138,316 | 8/1992 | Konishi | 341/67 |
| 5,146,325 | 9/1992 | Ng | 348/384 |
| 5,216,518 | 6/1993 | Yamagami | 358/133 |
| 5,225,832 | 7/1993 | Wang et al. | 341/67 |
| 5,245,338 | 9/1993 | Sun | 341/67 |
| 5,343,195 | 8/1994 | Cooper | 341/67 |

FOREIGN PATENT DOCUMENTS 9408427 4/1994 WIPO ............ H04N 7/130

OTHER PUBLICATIONS

Int. Org. for Standardization, Coding of Moving Pictures and Associated Audio, ISO/IEC JTC1/SC2/WG11/MPEG91/270, Nov. 1991, Proposal 06, Vadis/Cost Forward Prediction Coding, Submitted by G. Bjontegaard (Norweigian Telecom).

Int. Org. for Standardization, Coding of Moving Pictures and Associated Audio, ISO/IEC JTC1/SC2/WG11, MPEG92/452 Revision, Nov. 1992, Introduction of the Second VLC Table for Intra Coding by Y. Yagasaki et al. (Sony).

Int. Org. for Standardization, Coding of Moving Pictures and Associated Audio, ISO/IEC JTC1/SC29/WG11, MPEG92/704, Nov. 1992, London, Core Experiment Proposal on VLC Adaptation, by A. Puri et al.

Int. Org. for Standardization, Coding of Moving Pictures and Associated Audio, ISO/IEC JTC1/SC29/WG11, MPEG92/508, Sep. 1992, Tarrytown, Report on Quantization Core Experiments and A VLC Proposal by A. Puri et al.

Int. Org. for Standardization, Coding of Moving Pictures and Associated Audio, ISO/IEC JTC1/SC29/WG11, MPEG92/Sep. 1992, MPEG-2 Syntax Proposal in Support of the Cablelabs Profile (CLP) Requirements Document, by B. Haskell et al.

Int. Org. for Standardization, Coding of Moving Pictures and Associated Audio, ISO/IEC JTC1/SC29/WG11, MPEG92/ Sep. 1992, Core Experiment: Adaptive Switching of Coefficient VLC'S by Barry Haskell et al.

Primary Examiner—Tommy P. Chin
Assistant Examiner—Vu Le
Attorney, Agent, or Firm—Joseph S. Tripoli; Eric P. Herrmann; Ronald H. Kurdyla

[57] ABSTRACT

A variable length encoding/decoding system for use with a layered signal format, and for adaptively providing VLC changes without additional signal overhead, includes a plurality of VLC encoding tables, respective ones of the tables being preprogrammed with VLC codes associated with anticipated signal statistics. The layered signal includes blocks of data subject to common parameters which parameters may be associated with signal statistics. The blocks of data include information indicative of such parameters. Each packet is examined for the common parameter and responsive thereto a default VLC coding/decoding table is assigned. In a further embodiment the VLC table used for each successive codeword is made dependent upon the table utilized for the lastmost codeword and the relative value of the lastmost codeword.

18 Claims, 5 Drawing Sheets

ADAPTIVE VARIABLE LENGTH ENCODER/DECODER

This invention is related to apparatus for variable length coding compressed video signal, and more particularly to variable length coding/decoding apparatus which is self adaptive.

BACKGROUND OF THE INVENTION

Variable length or statistical encoders are designed to encode fixed length codewords with variable length codewords for signal transmission or storage purposes. On average this technique reduces the amount of data being transmitted or stored. Variable length coding, VLC, consists of determining the general statistics of a signal type to discern the frequency of occurrence of the respective amplitude values within the dynamic range of the signal to be coded, and then forming a code set of variable length codewords representing a similar dynamic range. Thereafter a correspondence is established between the input fixed length codewords and the variable length codewords such that input codewords occurring with the greatest frequency are assigned variable length codes of shorter bit width. Input codewords occurring most frequently are assigned variable length codewords of lesser bit-width then the input codewords thereby effecting on average the data reduction. Nominally once the variable length codeword-input codeword correspondence is established, the variable length codes are loaded in a memory at address locations in accordance with this correspondence. The input codewords are applied as addresses to the memory and the memory output provides the VLC encoded signal. Decoding is performed with a reciprocal table (in memory) at the receiver.

It is not uncommon for signal statistics to change such that a particular VLC may become less than efficient. This may be counteracted by continually monitoring the input signal statistics, and when they change by some predetermined measure, changing the variable length code to a more efficient variable length code. The respective codes may be loaded as separate tables in the encoding/decoding memories, with table selection accomplished by a control signal applied to a more significant memory address bit. (Selecting various tables in a common memory is a well known technique.)

If a plurality of tables are to be used for encoding a signal, VLC table changes at the encoder must be communicated to the receiver. Some known systems transmit the decoding tables whenever a VLC switch is effected. This of course is impractical if the signal statistics change frequently. Other systems transmit a Table Type codeword along with the encoded data, to inform the receiver that a code switch is effective and which of a plurality of tables to use for decoding. For systems that require frequent VLC changes, and have little signal overhead available, the Table Type codewords may overtax this type of system. A third situation arises wherein a system signal protocol has been standardized without provision for the foregoing types of VLC change, and it is desirable to use VLC changes in a system using the protocol. An example of such a system/protocol is the compressed video signal format being established by the Moving Picture Experts Group of the International Standardization Organization, and known as MPEG.

SUMMARY OF THE INVENTION

The present invention is a variable length encoding/decoding system for use with a layered signal format, and for adaptively providing VLC changes without additional signal overhead. A plurality of VLC encoding tables are provided, respective ones of the tables being preprogrammed with VLC codes associated with anticipated signal statistics. The layered signal includes blocks of data subject to common parameters which parameters may be associated with signal statistics. The blocks of data include information indicative of such parameters. Each packet is examined for the common parameter and responsive thereto a default VLC coding/decoding table is assigned. In a further embodiment the VLC table used for each successive codeword is made dependent upon the table utilized for the lastmost codeword and the relative value of the lastmost codeword.

DETAILED DESCRIPTION

Figure 1:
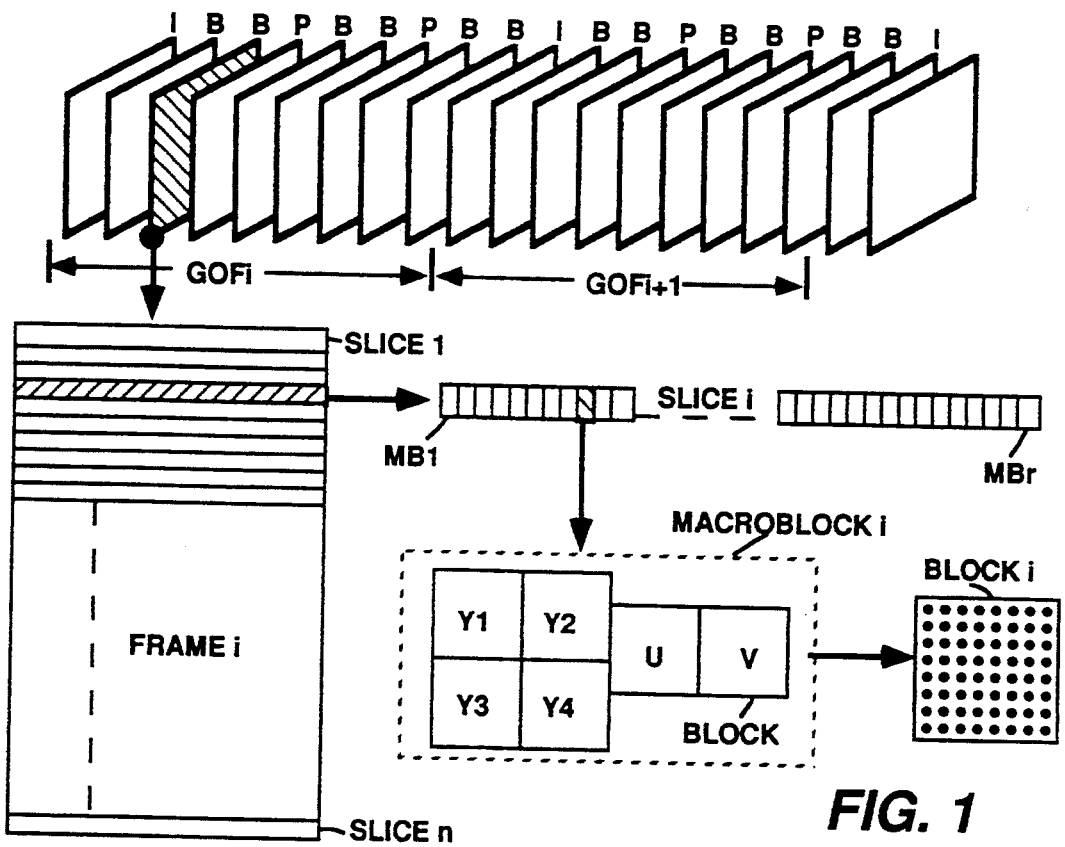
FIG. 1 is a pictorial representation of the MPEG-like signal coding hierarchy.
Figure 2:
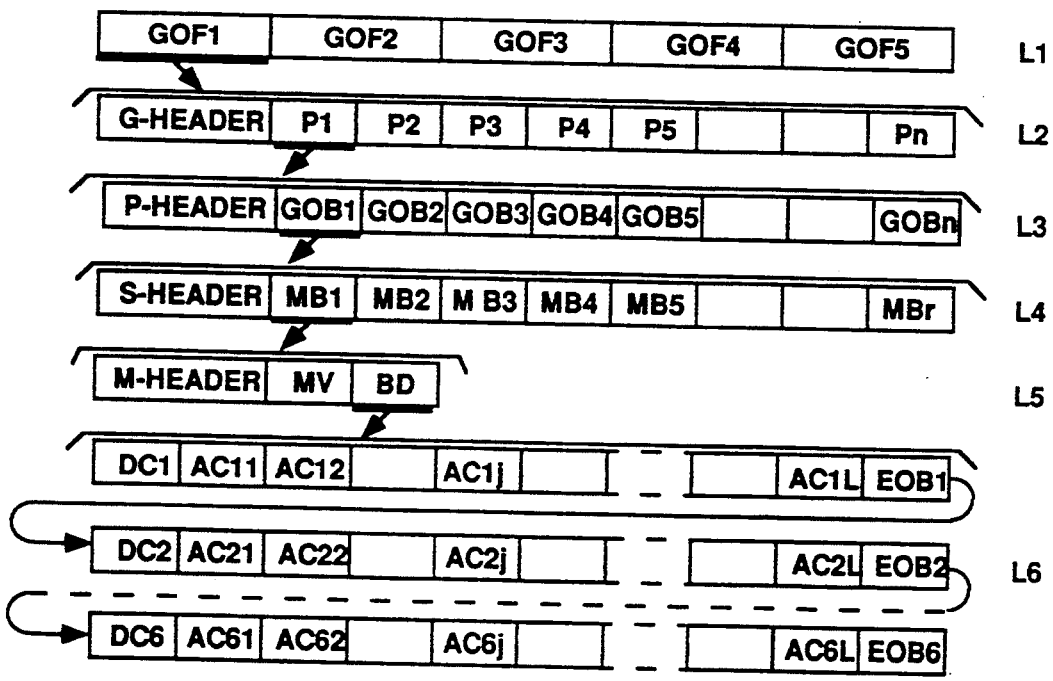
FIG. 2 is a pictorial representation of the format and contents of a transport packet of compressed video data.

The invention will be described in the environment of an MPEG like video signal compression/transmission system, however it should be appreciated that the invention may be practiced using other compression strategies wherein data having common characteristics are coalesced into respective groupings. Before describing the invention, the MPEG-like compressed signal format will be described with reference to FIGS. 1 and 2, to provide a background for understanding the terminology used herein. The MPEG protocol divides successively occurring frames into sequences or groups of frames, GOF. The frames in respective GOF's are compressed according to three processes, intraframe coding (I frames), forward interframe coding (P frames) and forward/backward interframe coding (B frames). Respective frames of coded data are divided into slices representing, for example, 16 image lines. Each slice is divided into macroblocks each of which represents, for example, a 16×16 matrix of pixels. Each macroblock is divided into 6 blocks including four blocks of information relating to luminance signal and two blocks of information relating to chrominance signal. The luminance and chrominance information are coded separately and then combined for transmission. The luminance blocks include data relating to respective 8×8 matrices of pixels. Each chrominance block comprises an 8×8 matrix of data relating to the entire 16×16 matrix of pixels represented by the macroblock.

Blocks of data, encoded according to intraframe coding, consist of matrices of Discrete Cosine Coefficients.

That is, respective 8×8 blocks of pixels are subjected to a Discrete Cosine Transform (DCT) to provide coded signal. The coefficients are subjected to adaptive quantization, and are run-length and variable-length encoded. Hence respective blocks of transmitted data may include fewer than an 8×8 matrix of codewords. Macroblocks of intraframe encoded data include information defining the level of quantization employed, a macroblock address or location indicator, a macroblock type (intra-coded), then the DCT coefficients for each of the six blocks within a macroblock, each of which is followed by an end of block code EOB.

Blocks of data encoded according to P or B interframe coding also consist of matrices of Discrete Cosine Coefficients. In this instance however the coefficients represent residues or differences between a predicted 8×8 pixel matrix and the actual 8×8 pixel matrix. These coefficients are also subjected to quantization and run- and variable-length coding. In the frame sequence I and P frames are designated anchor frames. Each P frame is predicted from the last-most occurring anchor frame. Each B frame is predicted from one or both of the anchor frames between which it is disposed. The predictive coding process involves generating displacement vectors which indicate which macroblock of an anchor frame most closely matches the macroblock of the predicted frame currently being coded. The pixel data of the matched block in the anchor frame is subtracted, on a pixel-by-pixel basis, from the block of the frame being encoded, to develop residues. The residues are subjected to the Discrete Cosine Transform and the transformed residues and the motion vectors comprise the coded data for the predictive frames. Even though a frame is predictive encoded, if no reasonable block matches can be found, a particular block or macroblock in the predictive frame may be intraframe coded. In addition certain ones of the macroblocks may not be encoded. Macroblocks are skipped by increasing the address of the next coded macroblock. Macroblocks of interframe encoded data include information defining the level of quantization employed, a macroblock address or location indicator, a macroblock type (intra-coded, inter-coded) then the DCT coefficients for each of the six blocks within a macroblock, each of which is followed by an end of block code EOB.

After the video data is coded, it is arranged according to an MPEG-like protocol. The MPEG hierarchical format includes a plurality of layers each with respective header information. Nominally each header includes a start code, data related to the respective layer and provision for adding header extensions. Much of the header information is required for synchronization purposes.

Figure 3:
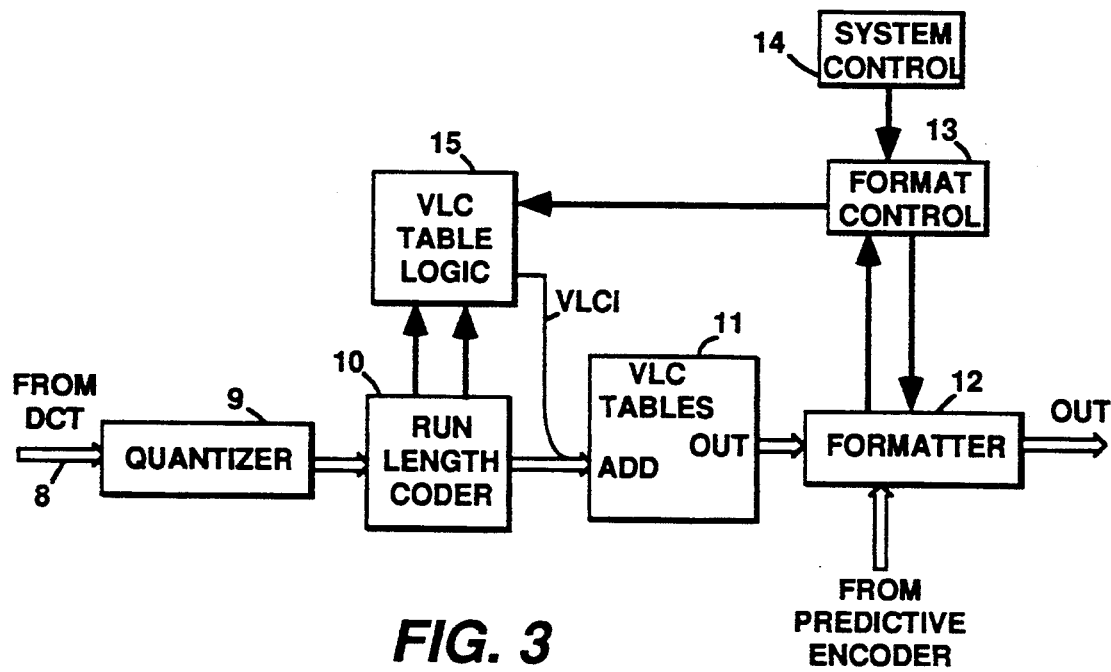
FIG. 3 is a block diagram of variable length encoding apparatus embodying the present invention.

FIG. 3 illustrates a portion of an exemplary MPEG encoder, including the variable length encoder. In FIG. 3 transform coefficients from a discrete cosine transform, DCT, apparatus (not shown) are applied to a quantizer 9 which limits the values of respective DCT coefficients. The quantization process reduces many of the DCT coefficients to zero value. The quantized coefficients are coupled to a run length encoder 10. The output of the run length encoder are codewords of fixed and constant bit-width. These fixed bit-width codewords each include a first portion, designated herein as RUN, conveying information related to the number of zero valued coefficients between the last non-zero valued coefficient and the subsequent non-zero valued coefficient, and a second portion, designated herein as LEVEL, corresponding to the value of the respective subsequent non-zero valued coefficients. These codewords are coupled to a variable length encoder VLC 11. The VLC is a memory programmed at respective address locations with variable length codewords corresponding to the address values. The memory includes at least two sets of VLC codewords located in two mutually exclusive tables. The respective tables are selected by application of selection bits to the most significant bits of the address values. In this instance the selection bits are provided by the VLC Table Logic element 15.

VLC coded data is coupled to a data formatter 12, which in conjunction with the Format Controller 13, arranges the processed data according to the MPEG protocol. The Format Controller 13 is controlled by a global system controller 14 which is programmed with higher level commands for establishing groups of frames, I, P, and B frames etc. Responsive to the system controller the format controller 13 forms the appropriate data sequences. The data for populating the sequences include the VLC coded coefficients from the VLC coder 11, motion vectors, macroblock code/no-code codewords, macroblock code types (intra/inter) etc from a predictive encoder (not shown) and different types of header data which is either accessed from tables within the formatter 12 or generated within the format controller 13 or the formatter 12.

The VLC table logic receives data from the run length encoder 10 and the format controller 13 for determining the VLC table to be used for each respective codeword. Since the VLC tables are selected dependently upon the encoded data it is designated an adaptive variable length encoder or AVLC.

Figure 4:
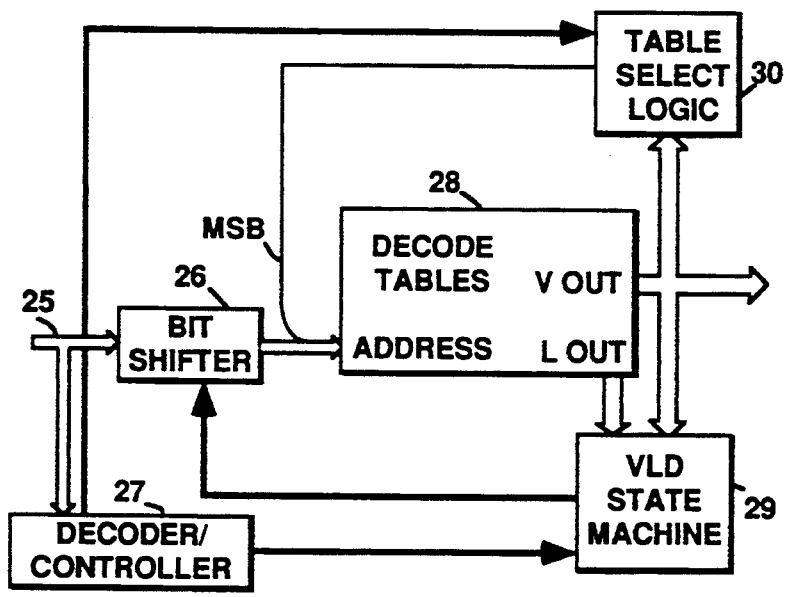
FIG. 4 is a block diagram of variable length decoding apparatus embodying the present invention.

FIG. 4 shows a variable length decoder VLD arranged to perform the reciprocal operation of the AVLC shown in FIG. 3. Absent the Table Select Logic 30, the elements of FIG. 4 illustrate a typical VLD. Variable length encoded data is applied on the bus 25 and coupled to a decoder/controller 27 and a bit shifter 26. The controller 27 recognizes particular codewords (e.g., headers) interposed in the data stream for synchronizing the overall apparatus. Responsive to the synchronizing codewords the controller sets a state machine to initiate decoding.

The input to a variable length decoder (VLD) is a bit stream without explicit word boundaries. The VLD performs successive sequences of; decoding a codeword, determining its length and shifting the input bit stream by the number of bits corresponding to the length of the codeword decoded before decoding the next codeword. The state machine 29 conditions the bit shifter to apply successive sequences of VLC codes to the address input port of a memory 28 in which are programmed decoding tables. The decoding tables provide not only decoded data but also the bit-widths of the corresponding decoded VLC. The bit-width information is applied to the state machine 29 from which it calculates subsequent control values to be applied to the bit shifter 26. The state machine may also be responsive to the decoded data for anticipating shifts in input data types in order to maintain proper decoding sequences. Whether or not the state machine is responsive to decoded data is dependent upon the sophistication of and the decoding tasks assigned to the controller 27.

In this system, absent the table selection logic 30, the memory 28 may include a plurality of decoding tables for decoding different types of data that occur at predetermined intervals. In this instance either the controller 27 or the state machine 29 will be arranged to recognize such intervals and switch between decoding tables. This type of decoding table switching is separate and distinct from the decoding of AVLC codes encoded as described with respect to FIG. 3.

The VLD is made an adaptive variable length decoder or AVLD by virtue of the table select logic 30. The table select logic 30 is responsive to the decoded data for determining which of a plurality of decoding tables resident in the memory 28 should be utilized for decoding the next variable length codeword.

In the present example the AVLC/AVLD utilize two coding/decoding tables. One of these tables is designated VLC0 (VLD0) and the other VLC1 (VLD1). The VLC0 (and reciprocal VLD0) table is optimized for smaller valued coefficients and the VLC1 (VLD1) table is optimized for larger valued coefficients. The VLC0 table is substantially similar to the MPEG recommended VLC encoding table.

The adaptivity of the variable length coding/decoding is dependent upon the block type (intraframe coded luminance and chrominance, or interframe coded luminance and chrominance) and the information contained in respective codewords provided by the run length coder. Recall that the respective codewords provided by the run length coder have a RUN component and a LEVEL component. Note that since the DCT coefficients for interframe coded data represent residues, their respective values tend to be smaller than for intraframe coefficients. A second criterion for selecting coding/decoding tables for each successive codeword is the character of the immediately preceding codeword. In this example the value of the RUN component and the LEVEL component are examined. If the coder (decoder) is currently conditioned to use coding/decoding table VLC0, and if the RUN value is zero and the LEVEL value is greater than a predetermined value V (for example V=1), coding/decoding is switched to coding/decoding table VLC1. And if the coder (decoder) is currently conditioned to use coding/decoding table VLC1, and if RUN is greater than one and the value LEVEL is less than or equal to V, the system switches to coding/decoding table VLC0. Finally if the preceding codeword is an end of block code, the system resets to coding/decoding table VLC0.

At the start of respective macroblocks the coding tables are set to default tables, VLC1 (VLD1) if the macroblock is intraframe coded and VLC0 (VLD0) if the macroblock is interframe coded, and at the end of each block within a macroblock, the coding table is reset to VLC0 (VLD0). The DC coefficient of respective blocks are thus coded according to these preset tables. After the first AC codeword of the first block of a macroblock is coded, the current table type and the values RUN and LEVEL are analyzed to determine the table VLCi to be used for the third codeword of the first block of the macroblock. The index i is saved and the coder is set to initially utilize table VLCi for the first codewords (excluding the DC coefficients) of the remaining blocks in the macroblock.

Figure 5:
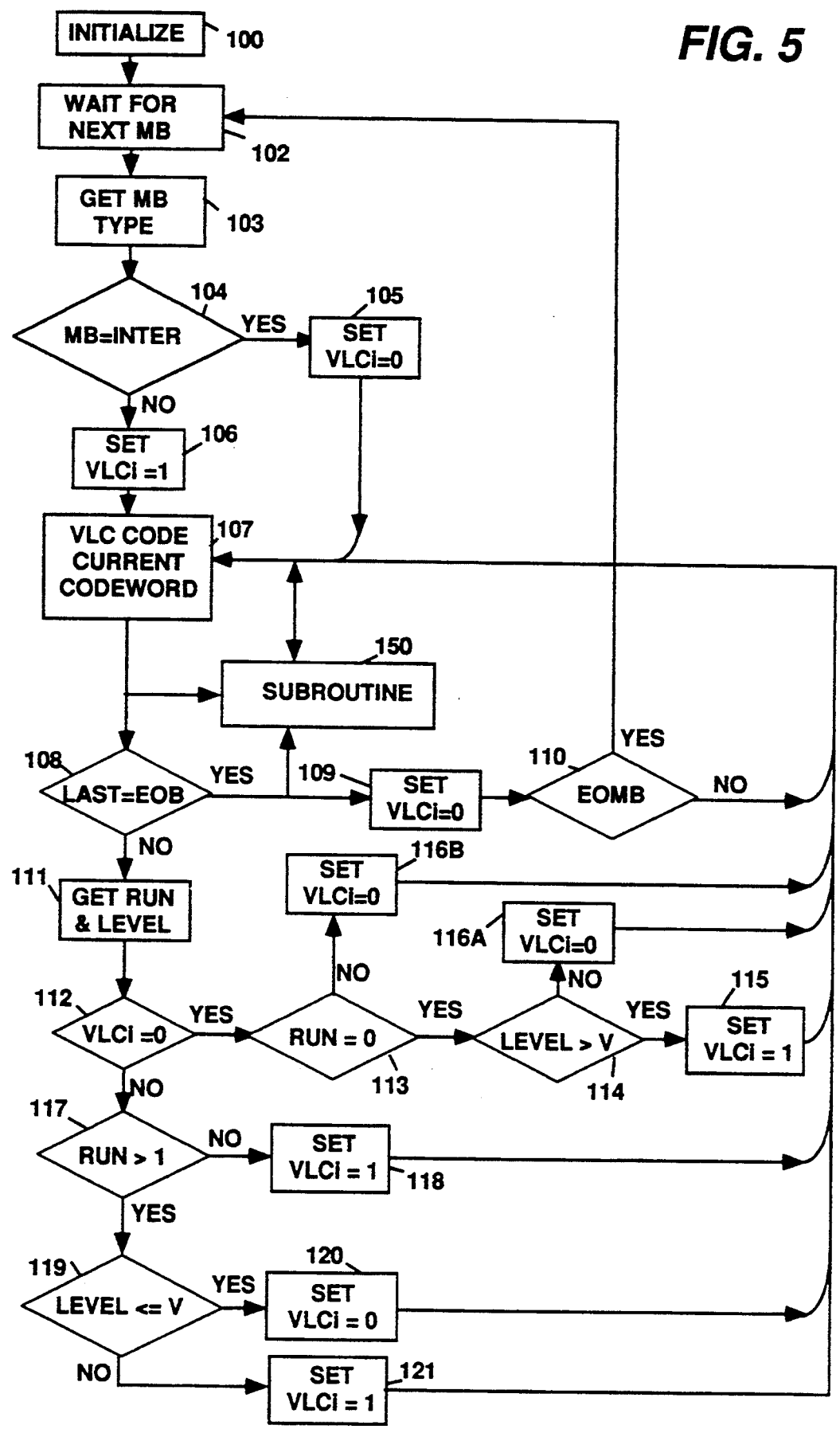
FIG. 5 is a flow chart of the operation of the TABLE LOGIC function shown in FIGS. 3 and 4.

The operation of the table logic for both the AVLC and the AVLD is shown in the flow chart of FIG. 5. Both systems operate similarly with the exception of the block 107. In the AVLD apparatus this block is a VLC decode current codeword process. The encoding/decoding system is initialized [100] by a global system controller. The encoder (decoder) then waits [102] for the first occurring macroblock MB, and when it arrives, obtains [103] its type. The MB type is examined [104] and if the type indicates that it is intraframe (interframe) encoded conditions the encoder (decoder) [105, 106] to utilize the VLC0 (VLC1) encoding/decoding table. The first coefficient in the MB is encoded/decoded [107] using this table. The codeword is checked [108] to determine if it is an EOB code. If it is the system resets [109] to table VLC0 conditioning the system for the first codeword in the next block. If the last codeword was an EOB a check is made [110] to determine if the EOB occurred at the end of a MB. If true the system is conditioned to wait for the next MB, if false the system is conditioned to encode (decode) the next codeword.

After a codeword is variable length encoded (decoded) [107], its RUN and LEVEL components are accessed [111]. Then, if the system is currently conditioned to use the encoding (decoding) table VLC0 [112] and the RUN value of the last codeword is equal to zero (for example) [113] and the value of LEVEL is greater than V [114] the system is switched [115] to utilize table VLC1 to encode/decode [107] the next codeword. If the current table is VLC0 and the latter two conditions are not met the systems continues to use table VLC0 [116A, 116B].

Alternatively if the system is currently conditioned to encode (decode) with table VLC1 and the RUN component is greater than 1 [117] and the LEVEL component is less than or equal to V [119] the system is switched [120] to encode (decode) with table VLC0. If the system is currently conditioned to encode (decode) with table VLC1 and the latter two conditions are not satisfied the system continues to utilize table VLC1 [118, 121].

Figure 6:
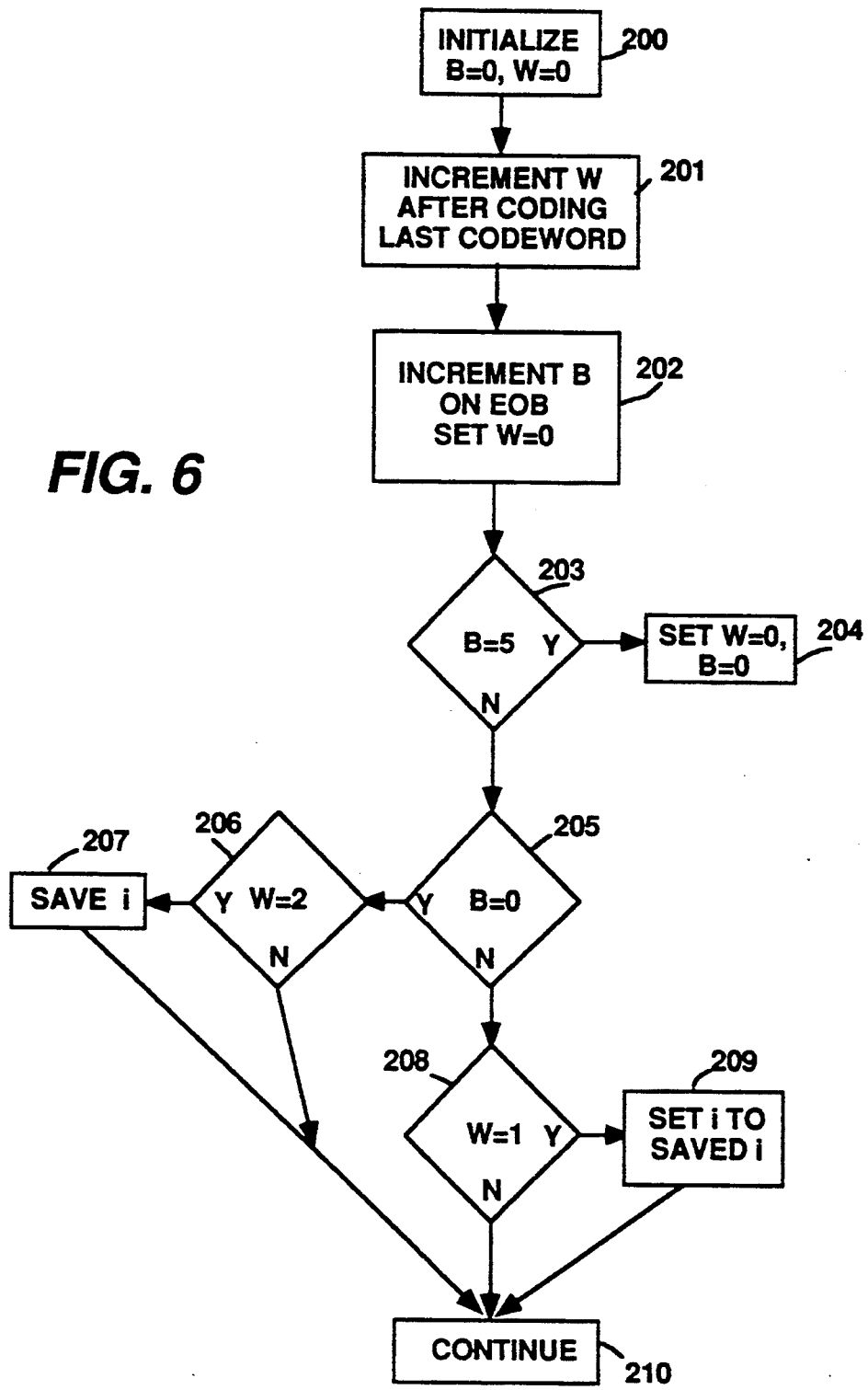
FIG. 6 is a flow chart of the subroutine step shown in FIG. 5.

FIG. 6 is a flow chart of the subroutine [150]. This subroutine sets the coding table for the first AC coefficients, in respective subsequent blocks of a macroblock, to the table VLCi determined for the third codeword (second codeword after the DC coefficient) of the first block of the macroblock. During the initialization [100] (FIG. 5) the subroutine is initialized [200] by resetting indices B and W to zero. The indices B and W in this example correspond to block and codeword counts. After each input codeword is coded the word count is incremented [201] and after each EOB the block count is incremented [202]. The index B is examined [203] to determine if all of the blocks in the macroblock have been processed. If they have the indices B and W are reset to zero. If all the blocks have not been coded the index B is checked [205] to determine if the coder is coding the first block (B=0) of the macroblock. If the system is coding the first block the index W is examined [206] to determine if the second codeword (excluding the DC coefficient) in the first block was last coded. If it was, the index i, corresponding to the table determined for coding the second codeword is saved [207]. If it was not, the system continues to the coding of the next codeword.

If the system is not coding the first block of the macroblock [205], but rather one of the subsequent blocks of a macroblock, the index W is checked [208] to determine if the next codeword to be processed corresponds to the first AC coefficient of that block. If so the index, i, saved at step [207], is used to set the coder [209] to utilize table VLCi for the codeword corresponding to the first AC coefficient of that block. If not the system continues at step [108].

Figure 7:
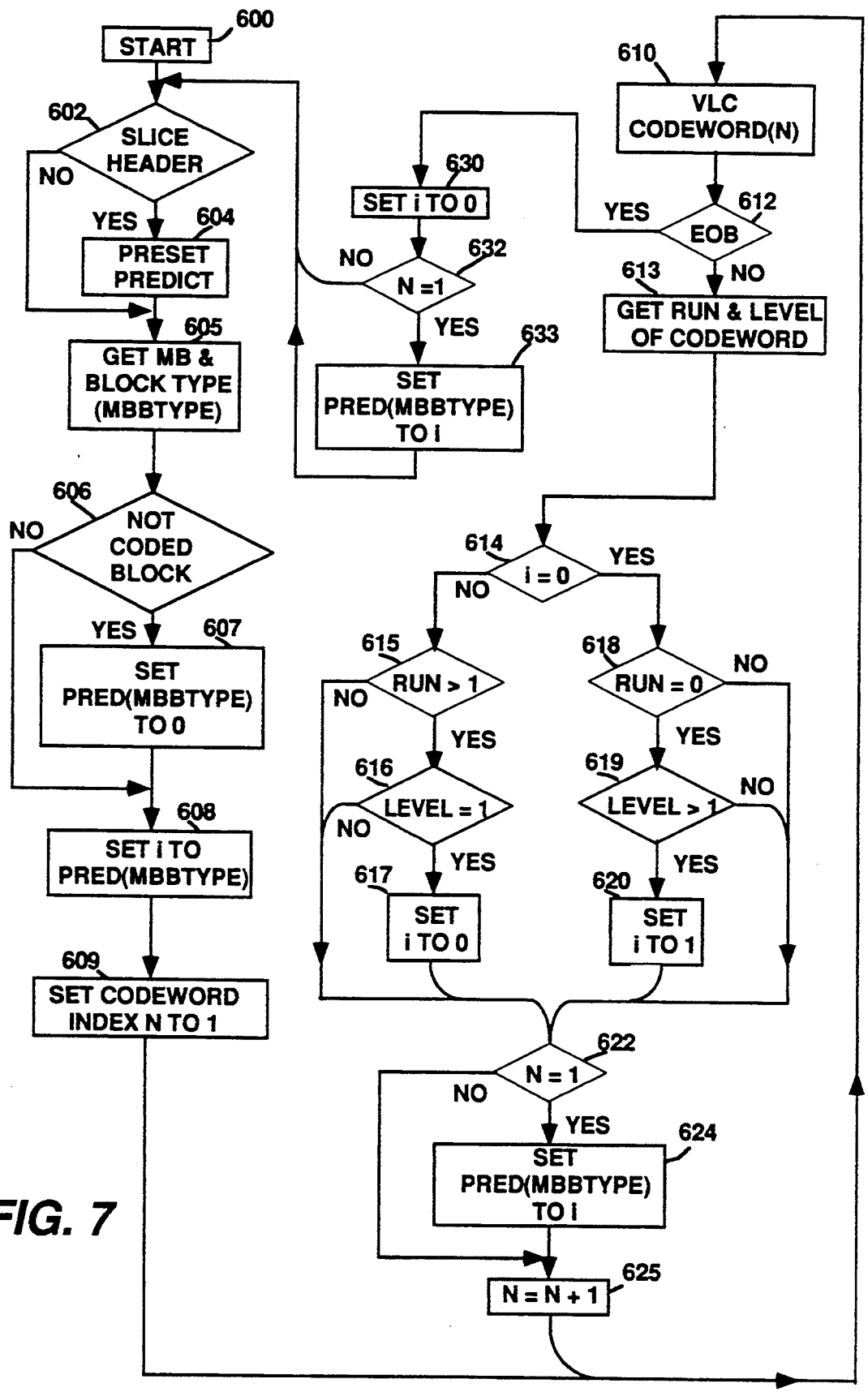
FIG. 7 is a flow chart of the operation of a further embodiment of the TABLE LOGIC function.

FIG. 7 is a flowchart exemplifying a second and preferred embodiment of the table selection function for making the AVLC (AVLD) self adaptive. In this embodiment the respective decoding table is preset at the beginning of a slice and thereafter the selected table is dependent upon predicted values. As in the above example table switching is determined by the current table in use and the values of RUN and LEVEL. However in this embodiment, the table utilized to code the second codeword (excluding the intra DC coefficient of a block type will be used to reinitialize the coding of the following blocks of the same type within an entire slice rather than on a macroblock basis.

In the following description it is presumed that the coder always codes according to the table VLCi or VLDi, and the index i is determined for respective blocks and codewords. The index is preset at the beginning of the coding of each block to variable predicted indices pred(MBBTYPE). The values pred(MBBTYPE) are set to default values at the beginning of each slice. Thereafter these indices are set to the index i used to decode the e.g., second codeword f each respective block type. That is, the first time a luma intraframe block is encountered, the pred(MBBTYPE) corresponding to that type of block is reset to the index i used to code the second codeword of that block. Similarly the first time a luma interframe, or chroma interframe, or chroma intraframe block is encountered the respective pred(MBBTYPE) is updated to the corresponding index i and retained for the remainder of the frame. Each time a new block occurs for coding, the table index is set to the respective pred(MBBTYPE) corresponding to the type of that block.

There are four pred(MBBTYPE) corresponding to intraframe coded luminance, interframe coded luminance, intraframe coded chrominance, and interframe coded chrominance. The default pred(MBBTYPE) for these four types are 1, 0, 1, 0 respectively. These default values are loaded into the respective pred(MBBTYPE) at the start of each slice of compressed video signal to be coded/decoded.

Referring to FIG. 7, at the start [600] of coding internal indices are set to initial values. When a slice of compressed video signal arrives [602] the respective pred(MBBTYPE) are set to the default values [604]. The macroblock header is examined for its type and thereby the block types [605]. The "type" variable is examined [606] to determine if the block is coded and if it is not the corresponding pred(MBBTYPE) is set to 0. If the block is coded then the index i, is set to the value of the pred(MBBTYPE) corresponding to the block type. A codeword index N is set to 1 at the beginning of each coded block [609]. Then codeword N is coded [610]. After each codeword is coded a check is made [612] to determine if it was an EOB code. If it was not, its RUN and LEVEL values are accessed [613], and the index i is conditionally switched [614–620] similar to the conditional switching described with respect to steps [111–121] of FIG. 5. The codeword index N is examined [622] to determine if the codeword was the first codeword of a block. (Note intraframe coded DC coefficients are not considered part of codewords N.) If the index N is not equal to 1, the index N is incremented by 1 and the next codeword is coded. If the index N is 1 the appropriate pred(MBBTYPE) is set [624] to the index i last determined. Once per slice that each respective pred(MBBTYPE) is constrained to be updated only once per slice. Then the index N is incremented and the next codeword is coded.

If at step [612] the last coded codeword is an EOB, the index i is set [630] to zero. The index N is examined [632] and if it does not equal 1 the system is conditioned to continue at [602] and get the next block of data. If the index N does equal 1 the appropriate pred(MBBTYPE) is set to the lastmost utilized index i.

In the above examples, the switching of encode/decode tables as a function of RUN and LEVEL variables tends to enhance overall system coding efficiency. If RUN is large it can be anticipated that the coefficients will be near zero. If in fact the LEVEL proves to be small, it can be anticipated that the next codeword may have similar attributes. Hence the system can be switched to take advantage of the similar attributes. In this case the relative statistics of subsequent codewords are estimated from the values of a prior codeword, and the coding table is selected based on the estimate of statistics. An alternative variable length encoding/decoding system may be made adaptive on the the value of the variable RUN, regardless of the value of the variable LEVEL.

The encoding and decoding apparatus are similar, and the same basic parameters are utilized in the same basic manner for effecting VLC (VLD) adaptivity. Therefore in the claims that follow, the terms variable length coder or coder are meant to encompass both an encoding apparatus or a decoding apparatus.

What is claimed is:

1. Apparatus for adaptively variable length coding compressed signal, said signal consisting of codewords arranged in mutually exclusive blocks of codewords according to whether said codewords were generated by a first or second processing method, and wherein indicia are associated with respective said blocks of codewords for identifying said first or second processing method, and with respective codewords including first and second signal components, said apparatus comprising:

a source of input codewords of said compressed signal;

coding means for selectively variable length coding said input codewords according to a first input codeword-output codeword correspondence in a first state VLC0, and according to a second input codeword-output codeword correspondence in a second state VLC1;

means, responsive to said indicia, for initializing said variable length coding means to one of said first and second states for each block according to said block being processed by said first method and second method respectively;

comparing means for comparing the first and second signal components of respective codewords to first and second reference values respectively, and conditioning said coding means to switch states when said coding means is in said first state and the first signal component is less than or equal to said first reference value and said second signal component is greater than said second reference value.

2. The apparatus set forth in claim 1 wherein said means for comparing also includes means for conditioning said variable length coding means to switch states when said coding means is in said second state and the first signal component is greater than said first reference value and said second signal component is less than or equal to said second reference.

3. The apparatus set forth in claim 1 wherein said blocks of codewords include subblocks of codewords, each of which includes an end of block code, and wherein said apparatus further includes:

means for detecting the occurrence of respective end of block codes and responsive to the detection of said end of block codes for resetting said means for variable length coding to a predetermined one of said first and second states.

4. The apparatus set forth in claim 1 wherein said blocks of codewords include subblocks of codewords occurring in a predetermined sequence, and said apparatus further includes:

storage means for storing an indication of the state, VLCi(i equals 1 or 0) of the coding means utilized for coding a predetermined input codeword of the first occurring subblock of a macroblock; and means responsive to said indication for conditioning the coding means to the state, VLCi, immediately prior to coding corresponding predetermined input codewords in respective remaining subblocks of a macroblock.

5. The apparatus set forth in claim 1 wherein said blocks of codewords include subblocks of codewords occurring in a predetermined sequence, and said apparatus further includes:

storage means for storing an indication of the state, VLCi (i equals 1 or 0), of the coding means utilized for coding a predetermined input codeword of the first occurring subblock of a macroblock, and for reinitializing the coding means to the state, VLCi, on the occurrence of subsequent subblocks, at a corresponding predetermined input codeword of said subsequent subblocks.

6. Apparatus for adaptively variable length encoding compressed signal of an MPEG type format (MPEG being the compressed video standard established by the Moving Picture Experts Group of the International standardization Organization) said compressed signal including codewords arranged in blocks of codewords, with groups of said blocks of codewords forming macroblocks, and the codewords of respective said macroblocks being generated exclusively by intraframe processing or interframe processing, and wherein indicia is associated with respective said blocks of codewords to indicate whether respective said blocks of codewords were generated according to said intraframe or said interframe processing, and wherein respective ones of codewords contain first and second signal components, said apparatus comprising:

a source of input codewords of said compressed signal.

means for variable length coding said input codewords to provide coded output codewords, and selectively operating in first and second states to code data according to first and second input codeword-to-coded-output codeword correspondences respectively;

means, responsive to said indicia, for initializing said variable length coding means to one of said first and second states for at least a first block of codewords of a first macroblock according to whether the codewords of said block of codewords were generated by said interframe processing and intraframe processing respectively;

means, including means for comparing the first signal component of respective said codewords to a first reference value, and for conditioning said variable length coding means to switch states when said coding means is in said first state and the first signal component is less than or equal to said first reference value, or said variable length coding means is in said second state and the first signal component is greater than said first reference value.

7. The apparatus set forth in claim 6 wherein said means, including means for comparing, includes means for conditioning said variable length coding means to switch states when said coding means is in said first state and the first signal component is less than or equal to said first reference value and said second signal component is greater than a second reference value, or said variable length coding means is in said second state and the first signal component is greater than said first reference value and said second signal component is less than or equal to said second reference value.

8. The apparatus set forth in claim 6 wherein each of said blocks of codewords includes an end of block code, and wherein said apparatus further includes:

means for detecting the occurrence of respective said end of block codes and responsive to the detection of said end of block codes for reinitializing said means for variable length coding to a predetermined one of said first and second states.

9. The apparatus set forth in claim 6 wherein said apparatus further includes:

means for storing an indication of the state, VLCi (i equals 1 or 0), of the means for variable length coding utilized for coding a predetermined input codeword of the first occurring block of a macroblock; and means responsive to said indication for reinitializing the means for variable length coding to the state, VLCi, at a predetermined input codeword of subsequent blocks of the same type.

10. The apparatus set forth in claim 6 wherein said macroblocks are aggregated into slices, and said apparatus further includes;

means for initializing the variable length coding means to respective default states for the first occurrence of each of respective intraframe processed and interframe processed block types in each slice;

means for storing respective indications of the state, VLCi (i equals 1 or 0), of the variable length coding means during coding of a predetermined input codeword of the first occurring block of codewords of respective block types; and means for reinitializing the means for variable length coding, at a corresponding predetermined input codeword of subsequent blocks of codewords of respective said block types in respective said slice, to the state, VLCi, indicated by the corresponding stored indications.

11. Apparatus for adaptively variable length coding compressed video signal, said compressed video signal occurring in mutually exclusive blocks of codewords according to the type of compression utilized (e.g. intraframe compression or interframe compression), said blocks of codewords being aggregated into macroblocks, and said macroblocks being aggregated into slices, said compressed video signal including information indicating the type of compression used for generating respective blocks of codewords, said apparatus comprising:

a source of input codewords of said compressed video signal;

means for variable length coding said input codewords to provide coded output codewords, and selectively operating in first and second states to code data according to first and second input codeword-to-coded-output codeword correspondences respectively;

means responsive to the state of the variable length coding means during coding of respective input codewords and the value of respective input codewords, for selectively switching said states;

means for initializing said variable length coding means to respective prearranged states for the first occurrence of respective block types in respective slices;

means for storing respective indications of the state, VLCi (i equals 1 or 0), of the variable length coding means during coding of a predetermined input word of the first occurring block of respective block types, where said block types refers to the type of compression used to generate respective said blocks; and means for reinitializing the means for variable length coding, at a predetermined codeword of subsequent blocks of respective like types in a slice, to the state, VLCi, indicated by the corresponding stored indications.

12. The apparatus set forth in claim 11 wherein said input codewords include first and second signal components and said means for variable length coding includes:

means, including means for comparing, for conditioning said variable length coding means to switch states when said variable length coding means is in said first state and the first signal component is less than or equal to a first reference value and said second signal component is greater than a second reference value, or said variable length coding means is in said second state and the first signal component is greater than said first reference value and said second signal component is less than or equal to said second reference value.

13. The apparatus set forth in claim 11 wherein respective blocks of codewords include end of block codes and said apparatus includes:

means responsive to end of block codes for conditioning said means for variable length coding to operate according to a predetermined one of said states, for a predetermined number of codewords after the occurrence of respective end of block codes.

14. Apparatus for adaptively variable length coding compressed video signal, said compressed video signal occurring in blocks of codewords respective said blocks of codewords being generated exclusively by intraframe or interframe compression type processes, said compressed video signal including information indicating said type of compression used for generating respective blocks of codewords, said apparatus comprising:

a source of input codewords of said compressed video signal;

coding means for variable length coding said input codewords to provide coded output codewords, and selectively operating in first and second states to code data according to first and second input codeword-to-coded-output codeword correspondences respectively;

means responsive to said information indicating the type of compression for initializing said coding means to respective prearranged states for ones of said blocks of codewords; and means responsive to the state of the coding means during coding of respective input codewords and the value of respective input codewords, for selectively switching states.

15. The apparatus set forth in claim 14 further including means for initializing the state of said coding means for coding others of said blocks of codewords according to the state of said coding means utilized for coding a predetermined codeword of a previously coded block of codewords of the same type.

16. The apparatus set forth in claim 14 wherein said codewords include at least two components and the means for variable length coding is responsive to at least one of said components of a respective codeword and the current state of said means for variable length coding, for determining the state of the means for variable length coding for coding the next subsequent codeword.

17. The apparatus set forth in claim 14 wherein said codewords include at least two components and the means for variable length coding is responsive to at least two of said components of a respective codeword and the current state of said means for variable length coding, for determining the state of the means for variable length coding for coding the next subsequent codeword.

18. Apparatus for adaptively variable length coding compressed video signal codewords occurring as runlength coded coefficients, respective codewords each having two components, one component representing a runlength value and the other component representing a coefficient amplitude value, and wherein said runlength codewords are aggregated into blocks of codewords, said apparatus comprising:

a source of input codewords of said compressed video signal;

coding means for variable length coding said input codewords to provide coded output codewords, and selectively operating in first and second states to code data according to first and second input codeword-to-coded-output codeword correspondences respectively;

means for setting said coding means to a predetermined one of said first and second states at the beginning of a block of codewords; and detecting means for detecting the value of at least one of said components of respective codewords, and responsive to the current state of said coding means and said value of at least one of said components conforming to a predetermined condition, causing said coding means to switch states.

* * * * *